United States Patent
Otremba et al.

(10) Patent No.: US 7,928,553 B2
(45) Date of Patent: Apr. 19, 2011

(54) POWER ELECTRONIC DEVICE (75) Inventors: Ralf Otremba, Kaufbeuren (DE); Oliver Haeberlen, Villach (AT); Klaus Schiess, Allensbach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/848,612

(22) Filed: Aug. 2, 2010

(65) Prior Publication Data
US 2010/0295171 A1 Nov. 25, 2010

Related U.S. Application Data (62) Division of application No. 11/962,883, filed on Dec. 21, 2007, now Pat. No. 7,799,614.

(51) Int. Cl.
*H01L 23/22* (2006.01)
*H01L 21/00* (2006.01)
(52) U.S. Cl. . 257/687; 257/698; 257/774; 257/E21.505; 257/E23.109; 438/152; 438/622
(58) Field of Classification Search .................. None
See application file for complete search history.

(56) References Cited

U.S. PATENT DOCUMENTS

| 6,133,634 | A | 10/2000 | Joshi |
| 6,297,549 | B1 | 10/2001 | Hiyoshi |
| 6,582,990 | B2 | 6/2003 | Standing |
| 6,624,522 | B2 | 9/2003 | Standing et al. |
| 6,677,669 | B2 | 1/2004 | Standing |
| 6,767,820 | B2 | 7/2004 | Standing et al. |
| 6,890,845 | B2 | 5/2005 | Standing et al. |
| 7,294,922 | B2 | 11/2007 | Jobetto et al. |
| 7,514,783 | B2 * | 4/2009 | Shimokawa et al. ......... 257/706 |
| 7,799,614 | B2 * | 9/2010 | Otremba et al. ............. 438/125 |
| 2002/0027276 | A1 | 3/2002 | Sakamoto et al. |
| 2006/0097380 | A1 * | 5/2006 | Sato ............................. 257/706 |
| 2007/0040186 | A1 * | 2/2007 | Fillion et al. .................. 257/177 |
| 2008/0048342 | A1 | 2/2008 | Cheah et al. |
| 2008/0224300 | A1 | 9/2008 | Otremba |
| 2009/0039498 | A1 | 2/2009 | Bayerer |
| 2009/0166832 | A1 | 7/2009 | Dunne |
| 2010/0065962 | A1 | 3/2010 | Bayerer |

FOREIGN PATENT DOCUMENTS

| DE | 19954941 A1 | 6/2001 |
| DE | 102004019445 A1 | 11/2005 |
| DE | 102007019686 A1 | 11/2007 |
| WO | 03030247 A2 | 4/2003 |

* cited by examiner

*Primary Examiner* — Alonzo Chambliss
(74) *Attorney, Agent, or Firm* — Dicke, Billig & Czaja, PLLC (57) ABSTRACT

An electronic device and method is disclosed. In one embodiment, a method includes providing an electrically insulating substrate. A first electrically conductive layer is applied over the electrically insulating substrate. A first semiconductor chip is placed over the first electrically conductive layer. The first semiconductor chip comprises a first electrode on a first main surface and a second electrode on a second main surface. An electrically insulating layer is applied over the first electrically conductive layer. A second electrically conductive layer is applied over the electrically insulating layer. A through connection is provided in the electrically insulating layer to couple the first electrically conductive layer to the second electrically conductive layer.

13 Claims, 5 Drawing Sheets

POWER ELECTRONIC DEVICE

CROSS-REFERENCE TO RELATED APPLICATIONS

This Utility Patent Application is a divisional application of U.S. application Ser. No. 11/962,883, filed Dec. 21, 2007, which is incorporated herein by reference.

BACKGROUND

This invention relates to an electronic device and a method of assembling thereof.

Electronic devices may include two or more components which are electrically coupled to one another or electrically insulated from one another. The electronic devices may, therefore, contain both electrically conductive means and electrically insulating means so as to provide the desired arrangement within the device.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Devices including an electrically insulating substrate are described below. The substrate may be of any shape, size or material. The electrically insulating substrate need not be homogenous or manufactured from just one material, that is to say various compositions and concentrations of the materials contained in the substrate are possible. During the fabrication of the device the substrate may be provided in a way that other substrates are arranged in the vicinity and are connected by a connector or connection means to the substrate with the purpose of separating the substrates. The substrate may be fabricated exclusively from electrically insulating materials. For example, the substrate may be fabricated from a ceramic insulator, such as $AL_2O_3$ or AlN. The substrate may, for example, be a DCB (Direct Copper Bonded) substrate which is a ceramic substrate on which one or more copper foils are attached. In one embodiment, the substrate may be fabricated from conductors or semiconductors and at least one surface of the substrate may be electrically insulating. The insulating properties of this surface may be due to an electrically insulating layer coating this surface, which may, for example, be made from organic materials, such as imide, epoxy or duroplast, metal oxides, semiconductor oxides, ceramics or diamond-like carbon. The electrically insulating layer may be fabricated using any appropriate techniques, for example physical or chemical vapor deposition, deposition from a solution or lamination. In case the substrate consists of a semiconductor material, such as silicon, the electrically insulating surface of the substrate may be produced by doping the semiconductor material such that p-type and n-type semiconductors are together in very close contact. In the border region between the p-type and n-type semiconductors a p-n junction is created, which has the electrical properties of a diode. This diode allows a flow of electricity in one direction but not in the opposite direction.

The substrate may contain a thermally conductive material. The thermal conductivity of this material may be higher than 10, 20, 30, 40, 50, 60, 70, 80, 90, 100, 110, 120, 130, 140 or 150 W/(m·K) (units in Watt/(meter·Kelvin)). For example, silicon has a thermal conductivity of more than 100 W/(m·K) and diamond-like carbon of more than 1000 W/(m·K).

The devices described below may further include one or more semiconductor chips. The semiconductor chips may, for example, be placed over the electrically insulating substrate. In case, the substrate includes an electrically insulating surface and the rest of the substrate is electrically conductive, the semiconductor chips may be placed over the electrically insulating surface of the substrate. The semiconductor chips may be of extremely different types and may include for example integrated electrical or electro-optical circuits. The semiconductor chips may be, for example, configured as power transistors, power diodes, IGBTs (Insulated Gate Bipolar Transistors), control circuits, driver circuits, microprocessors or microelectromechanical components. In one embodiment, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact pads in one embodiment on its two main surfaces, that is to say on its top side and bottom side. In one embodiment, power transistors, power diodes and IGBTs may have a vertical structure. By way of example, the source electrode and gate electrode of a power transistor and the anode electrode of a power diode may be situated on one main surface, while the drain electrode of the power transistor and the cathode electrode of the power diode are arranged on the other main surface. A power diode may be embodied in one embodiment as a Schottky diode. Furthermore, the devices described below may include integrated circuits to control and/or drive the integrated circuits of other semiconductor chips, for example, the integrated circuits of power transistors or power diodes. The semiconductor chips need not be manufactured from specific semiconductor material and, furthermore, may contain inorganic and/or organic materials that are not semiconductors, such as for example insulators, plastics or metals. Moreover, the semiconductor chips may be packaged or unpackaged.

One or more electrically conductive layers may be applied over the substrate, the semiconductor chips and/or any other component. The electrically conductive layers may be used as wiring layers to make electrical contact with the semiconductor chips from outside the devices or to make electrical contact with other semiconductor chips and/or components contained in the devices. The electrically conductive layers may be manufactured with any desired geometric shape and any desired material composition. The electrically conductive layers may, for example, be composed of conductor tracks, but may also be in the form of a layer covering an area. Any desired electrically conductive materials, such as metals, for example aluminum, nickel, palladium, silver, tin, gold or copper, metal alloys, metal stacks or organic conductors, may be used as the material. The electrically conductive layers need not be homogenous or manufactured from just one material, that is to say various compositions and concentrations of the materials contained in the electrically conductive layers are possible. Furthermore, the electrically conductive layers may be arranged above or below or between dielectric layers. The electrically conductive layers may also be thermally conductive so that they can dissipate the heat generated by the semiconductor chips.

The devices include one or more electrically insulating layers. The electrically insulating layers may cover any fraction of any number of surfaces of the components of the device. The electrically insulating layers may serve various functions. They may be used, for example, to electrically insulate components of the device from each other and/or from external components, but they may also be used as platforms to mount other components, for example wiring layers. The electrically insulating layers may be fabricated using various techniques. For example, the electrically insulating layers may be deposited from a gas phase or a solution or may be laminated as foils. The electrically insulating layers may, for example, be made from organic materials, such as imide, epoxy or duroplast, metal oxides, semiconductor oxides, ceramics or diamond-like carbon.

The devices may include a mold material covering at least parts of the components of the devices. The mold material may be any appropriate thermoplastic or thermosetting material. Various techniques may be employed to cover the components with the mold material, for example compression molding or injection molding.

Figure 1A:
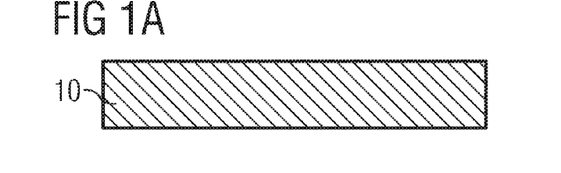
FIGS. 1A to 1E schematically illustrate an exemplary embodiment of a method to fabricate a device 100.
Figure 1B:
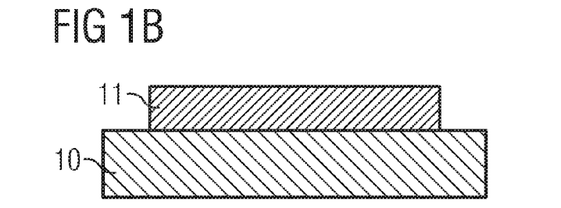
Figure 1C:
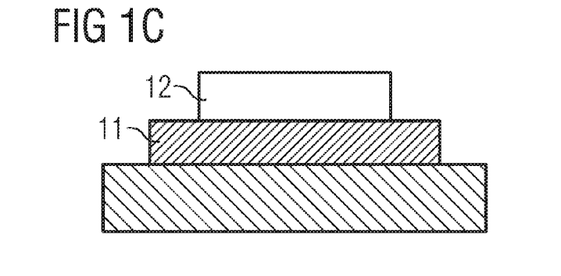
Figure 1D:
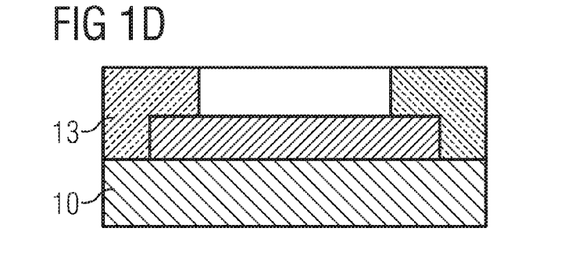
Figure 1E:
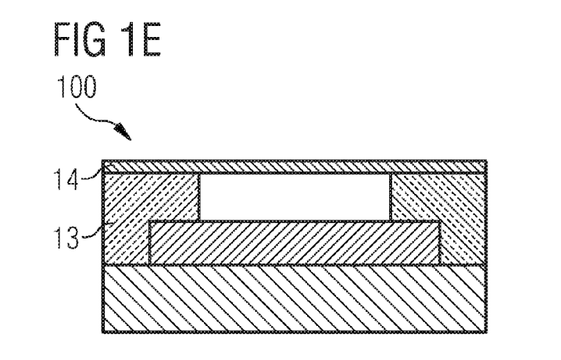

FIGS. 1A to 1E schematically illustrate a method for production of a device 100. A cross section of the device 100 obtained by the method is illustrated in FIG. 1E. Firstly, an electrically insulating substrate 10 is provided (see FIG. 1A). A first electrically conductive layer 11 is applied over the electrically insulating substrate 10 (see FIG. 1B). Over the first electrically conductive layer 11, a first semiconductor chip 12 is placed (see FIG. 1C). An electrically insulating layer 13 is applied over the first electrically conductive layer 11 (see FIG. 1D). The electrically insulating layer 13 may also cover the substrate 10 and the first semiconductor chip 12. A second electrically conductive layer 14 is applied over the electrically insulating layer 13 (see FIG. 1E).

Figure 2A:
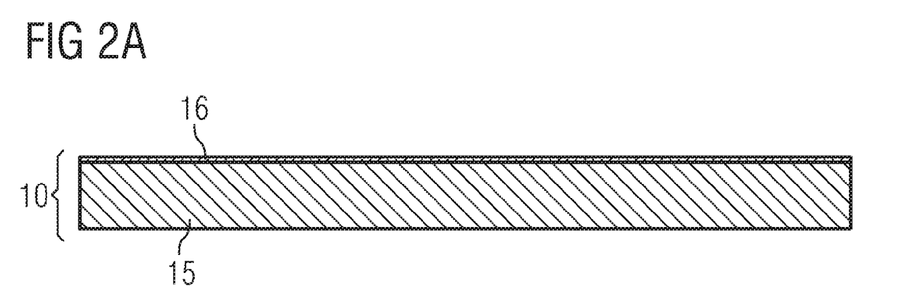
FIGS. 2A to 2I schematically illustrate a further exemplary embodiment of a method to fabricate a device 200.
Figure 2B:
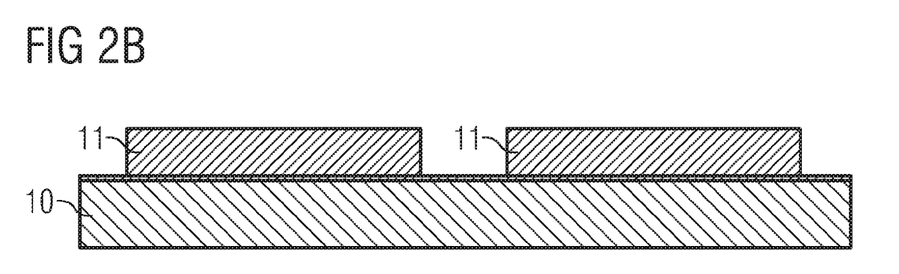
Figure 2C:
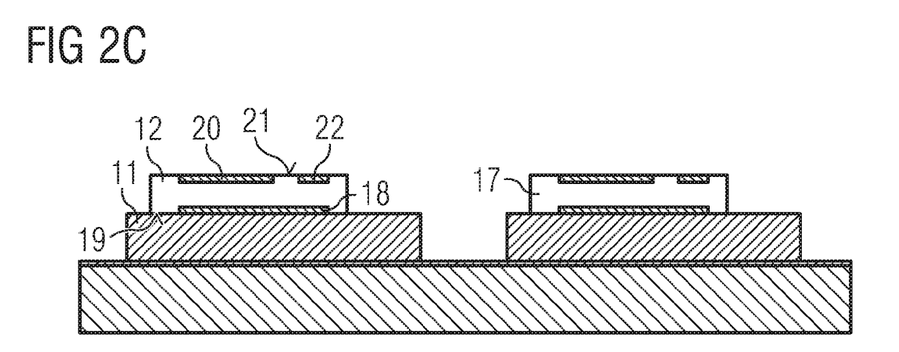
Figure 2D:
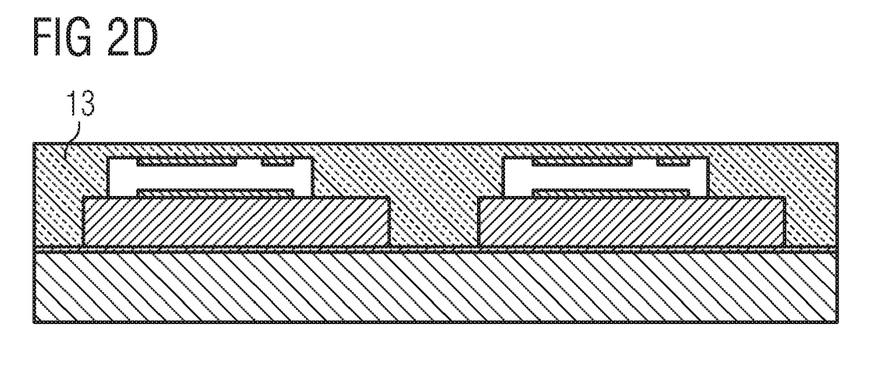
Figure 2E:
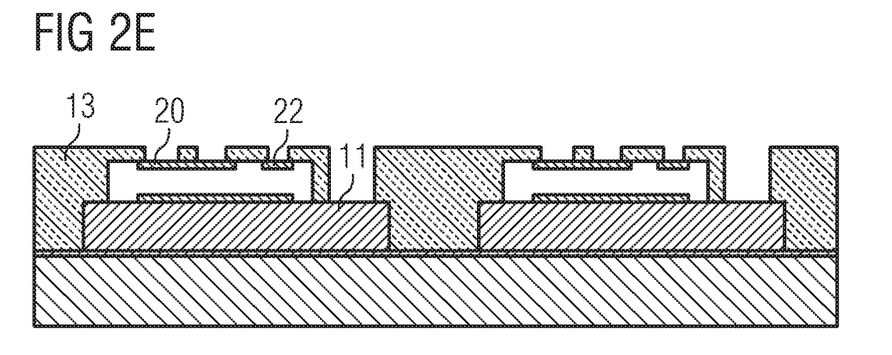
Figure 2F:
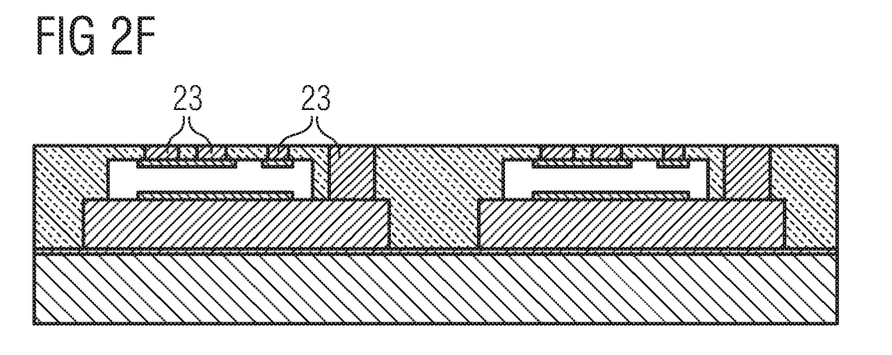
Figure 2G:
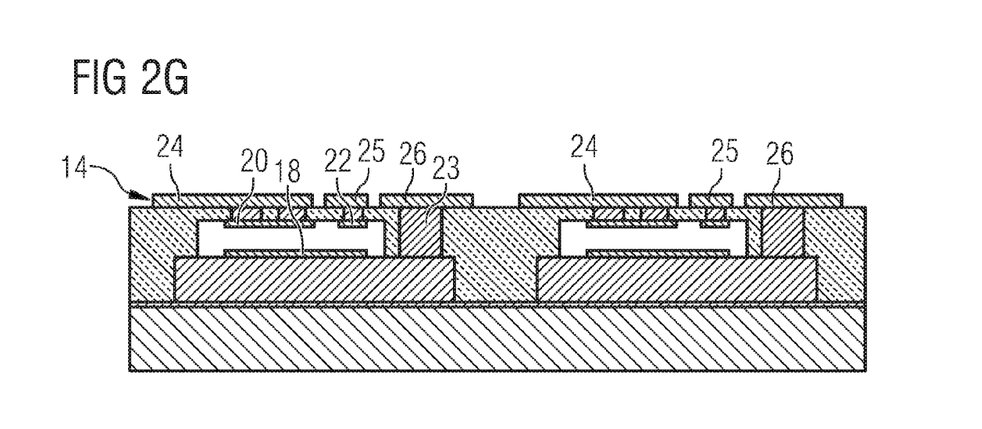
Figure 2H:
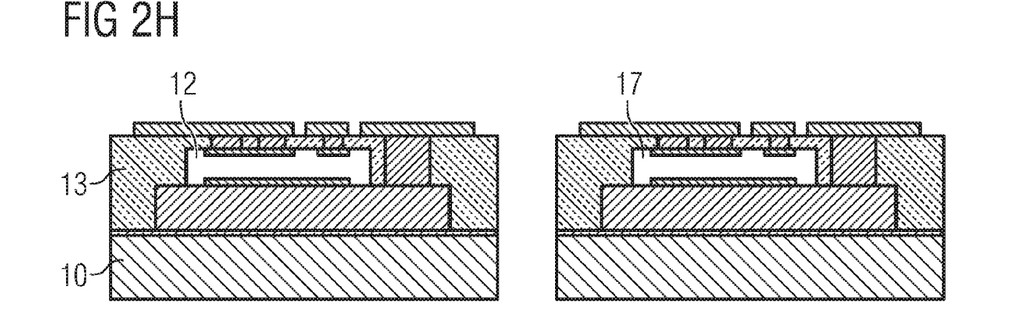
Figure 2I:
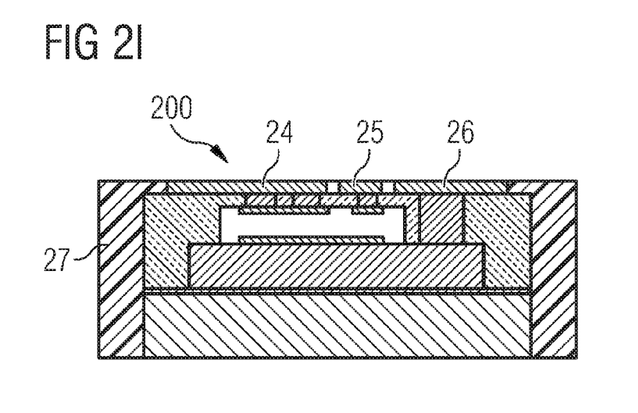

FIGS. 2A to 2I schematically illustrate a method for production of a device 200, a cross section of which is illustrated in FIG. 2I. The method illustrated in FIGS. 2A to 2I is a development of the method illustrated in FIGS. 1A to 1E. The details of the production method that are described below can therefore be likewise applied to the method of FIGS. 1A to 1E.

In FIG. 2A the electrically insulating substrate 10 is provided. The substrate 10 may be a plate made of a rigid material and may have a flat surface on which the components of the device 200 to be fabricated may be placed. The shape of the substrate 10 is not limited to any size or geometric shape, for example the substrate 10 may be round or square-shaped. The substrate 10 may have a thickness in the range from 100 µm to 1 mm or may be even thicker. The electrically insulating substrate 10 may for example be fabricated from a ceramic material, such as $Al_2O_3$ or AlN. In one embodiment, the substrate 10 may consist of an electrically conducting or semiconducting body 15 and an electrically insulating layer 16 applied over the body 15 as illustrated in FIG. 2A. The body 15 may, for example, be a silicon substrate. The electrically insulating layer 16 may, for example, be made from organic materials, such as imide, epoxy or duroplast, metal oxides, semiconductor oxides, ceramics or diamond-like carbon. If the body 15 consists of a semiconductor material, such as silicon, the electrically insulating layer 16 may be produced by doping the semiconductor material such that p-type and n-type semiconductors are together in very close contact. In the border region between the p-type and n-type semiconductors a diode is created which allows a current to flow through the substrate 10 only in one direction but not in opposite direction. For example, the doping of the semiconductor body 15 may be carried out in such a way that no electricity can flow from the top surface of the substrate 10 to its bottom surface.

The thickness of the electrically insulating layer 16 may be in the range from 1 to 20 µm and may depend on the voltages which are applied to the semiconductor chip 12. If for example, a maximum voltage of around 1000 V may be applied to the semiconductor chip 12 and the electrically insulating layer 16 has the ability to cause a voltage drop of 100 V per µm, the electrically insulating layer 16 should have a thickness of at least 10 µm in order to electrically insulate the bottom surface of the substrate 10 from the voltage applied to the semiconductor chip 12.

The substrate 10 or the body 15 may be manufactured from a material having a thermal conductivity of more than 10 W/(m·K). Furthermore, the material of the substrate 10 or the body 15 may have a thermal conductivity of more than 20, 30, 40, 50, 60, 70, 80, 90, 100, 110, 120, 130, 140 or 150 W/(m·K). Materials which have a thermal conductivity higher than 10 W/(m·K) are, for example, silicon and ceramic materials. The thermal conductivity of the substrate 10 may help to dissipate the heat generated by the semiconductor chip 12. The material and the thickness of the electrically insulating layer 16 may be chosen such that the electrically insulating layer 16 allows an adequate thermal conduction from the semiconductor chip 12 to the body 15.

As illustrated in FIG. 2B, the first electrically conductive layer 11 is deposited on the substrate 10. If the substrate 10 consists of the body 15 and the electrically insulating layer 16, the first electrically conductive layer 11 may be deposited onto the electrically insulating layer 16. The first electrically conductive layer 11 may have a thickness in the range from 10 to 400 µm, in one embodiment in the range from 80 to 120 µm and more particular around 100 µm. The first electrically conductive layer 11 may be structured such that only some areas of the substrate 10 are covered by the first electrically conductive layer 11. For example, after structuring the first electrically conductive layer 11 may consist of an array of electrically conductive pads arranged on the substrate 10 (only two of the pads are illustrated in FIG. 2B). Copper, iron, nickel, aluminum or other metals or metal alloys may be used as materials for the first electrically conductive layer 11.

The first electrically conductive layer 11 may be fabricated by using a galvanic deposition method. For that, a seed layer is first deposited onto the top surface of the substrate 10. The seed layer usually has a thickness of some hundred nanometers. Materials such as palladium or titanium may be used for the seed layer.

The thickness of the seed layer may be increased by depositing a further layer of an electrically conductive material onto the seed layer. For example, a layer of copper may be electroless deposited onto the seed layer. This copper layer may have a thickness of less than 1 μm. Afterwards another layer of copper may be galvanically deposited, which may have a thickness of more than 10 μm. The electroless copper deposition may also be omitted. The first electrically conductive layer 11 may be structured after the completed deposition process of all its layers or after the deposition of the seed layer.

In one embodiment, the seed layer may be deposited by a vacuum deposition process, such as sputtering. For example, first a layer of titanium having a thickness of, for example, about 50 nm and afterwards a layer of copper having a thickness of, for example, about 200 nm are sputtered. The copper layer may then be used as a seed layer to galvanically deposit a further copper layer having a thickness of more than 10 μm.

In one or more embodiments, other deposition methods, such as physical vapor deposition, chemical vapor deposition, spin-on processes, spray deposition or ink jet printing may also be used. Furthermore, the first electrically conductive layer 11 may be a metal film, for example a copper film, which is laminated onto the top surface of the substrate 10. Vacuum, heat and pressure may be applied for a time suitable to attach the first electrically conductive layer 11 to the substrate 10.

According to a further embodiment, the substrate 10 and the first electrically conductive layer 11 may be pre-fabricated as a DCB (Direct Copper Bonded) substrate. A DCB substrate consists of a ceramic substrate, to which copper foil is attached.

As illustrated in FIG. 2C, the first semiconductor chip 12 and a second semiconductor chip 17 as well as possibly further semiconductor chips are placed over the first electrically conductive layer 11. For example, on each pad of the first electrically conductive layer 11 a single semiconductor chip is mounted. The semiconductor chips 12 and 17 as well as all other semiconductor chips described herein may have been fabricated on a wafer made of semiconductor material. After dicing the wafer and thereby separating the individual semiconductor chips 12 and 17, the semiconductor chips 12 and 17 are relocated on the substrate 10 in larger spacings as they have been in the wafer bond. The semiconductor chips 12 and 17 may have been manufactured on the same wafer, but may have been manufactured on different wafers. Furthermore, the semiconductor chips 12 and 17 may be physically identical, but may also contain different integrated circuits.

The semiconductor chips 12 and 17 may have a first electrode 18 on a first main surface 19 and a second electrode 20 on a second main surface 21 that is opposite to the first main surface 19. The semiconductor chips 12 and 17 may, for example, be IGBTs (Insulated Gate Bipolar Transistor), vertical power diodes or vertical power transistors, for example power MOSFETs. In the latter case, which is exemplarily illustrated in FIG. 2C, the first and second electrodes 18 and 20 may be drain and source electrodes, respectively. Furthermore, the semiconductor chips 12 and 17 may have a third electrode 22 on the second main surface 21 functioning as a gate terminal in the case the semiconductor chips 12 and 17 are power transistors. The semiconductor chips 12 and 17 are mounted on the first electrically conductive layer 11 with their first main surfaces 19 facing the first electrically conductive layer 11. The drain electrodes 18 may be electrically connected to the respective pads of the first electrically conductive layer 11.

The electrical connections between the drain electrodes 18 of the semiconductor chips 12 and 17 and the first electrically conductive layer 11 may, for example, be produced by reflow soldering, vacuum soldering, diffusion soldering or adhesive bonding by using an electrically conductive adhesive.

If diffusion soldering is used as a connecting technique, it is possible to use solder materials which lead to intermetallic phases after the end of the soldering operation at the interface between the first electrically conductive layer 11 and the respective semiconductor chip 12 and 17 on account of interface diffusion processes. In this case, the use of Sn, AuSn, AgSn, CuSn, AgIn, AuIn, CuIn, AuSi or Au solders is conceivable. If the semiconductor chips 12 and 17 are adhesively bonded to the first electrically conductive layer 11, it is possible to use electrically conductive adhesives which may be based on epoxy resins and be enriched with gold, silver, nickel or copper in order to produce the electrical conductivity.

The electrically insulating layer 13 is deposited on the first electrically conductive layer 11 (see FIG. 2D). The electrically insulating layer 13 may also cover the exposed parts of the substrate 10 and the semiconductor chips 12 and 17. The electrically insulating layer 13 may be laminated as a foil or sheet onto the underlying structures by applying vacuum as well as heat and pressure for a suitable time. It may also be provided that an electrically insulating material is deposited from a solution or a gas phase and may be built-up in a layer-by-layer fashion to a desired thickness. Techniques that can be employed for this kind of deposition are, for example, physical or chemical vapor deposition, spinning, dispensing, dipping, injection molding or compression molding. The electrically insulating layer 13 may be fabricated from a polymer, such as parylene, a photoresist material, a silicone, a mold material or an inorganic, ceramic-like material, such as silicone-carbon compounds.

The electrically insulating layer 13 may cover the semiconductor chips 12 and 17 as illustrated in FIG. 2D. In one embodiment, at least the second main surfaces 21 of the semiconductor chips 12 and 17 may be left exposed.

The electrically insulating layer 13 may be structured as illustrated in FIG. 2E. A plurality of cutouts or through-holes are created in the electrically insulating layer 13 to expose at least portions of the source electrodes 20 and the gate electrodes 22 of the power transistors 12 and 17 as well as portions of the upper surfaces of the pads of the first electrically conductive layer 11 so that electrical connections can be made to those exposed regions. The electrically insulating layer 13 may, for example, be structured by a stamping process, laser ablation, etching, photo-lithographic structuring or any other suitable process known to a person skilled in the art.

In a further embodiment, which is not illustrated in the Figures, the electrically insulating layer 13 is provided as a polymer foil or sheet with a plurality of cutouts or through-holes before it is laminated onto the first electrically conductive layer 11. The cutouts or through-holes may be provided by stamping out regions of the polymer foil or sheet. The size and arrangement of these regions correspond to the size and arrangement of the surfaces of the elements, which are desired to be exposed.

The cutouts or through-holes produced in the electrically insulating layer 13 may be filled with an electrically conductive material in order to form through-connections 23 in the electrically insulating layer 13 (see FIG. 2F). The electrically conductive material may be a metal, such as copper or aluminum, or a metal alloy, such as SnAg or SnAu. The through-connections 23 may be produced by employing the same or similar methods as described above in connection with the production of the first electrically conductive layer 11.

The electrically insulating layer 13 acts as a platform for the deposition of the second electrically conductive layer 14 (see FIG. 2G). The second electrically conductive layer 14 may be deposited using the same or similar methods and materials as presented above for the deposition of the first electrically conductive layer 11, for example plating processes. The second electrically conductive layer 14 may have a thickness of more than 10 μm. The second electrically conductive 14 may be structured to form external contact elements 24, 25 and 26 as illustrated in FIG. 2G. The external contact elements 24, 25 and 26 are electrically coupled to the source electrode 20, the gate electrode 22 and the drain electrode 18, respectively, of the semiconductor chips 12 and 17 via the through-connections 23. It may be provided that the external contact element 24 is coupled to the source electrode 20 via two or more through-connections 23 as exemplarily illustrated in FIG. 2G. Analogously, the contact element 26 may be coupled to the drain electrode 18 via two or more through-connections 23. The external contact elements 24 to 26 may extend over the outline of the semiconductor chips 12 and 17. The external contact elements 24 to 26 allow to electrically contact the semiconductor chips 12 and 17 from outside the devices 200. It may also be provided that a redistribution layer is applied to the electrically insulating layer 13 including one or more wiring layers embedded in one or more dielectric layers.

As illustrated in FIG. 2H, the two semiconductor chips 12 and 17 are separated from one another by separation of the substrate 10 and the electrically insulating layer 13, for example by sawing.

After the singulation of the semiconductor chips 12 an 17, a mold transfer process may be carried out to encapsulate the components arranged on the substrate 10 with a mold material 27 (see FIG. 2I). The mold material 27 may encapsulate any portion of the device 200, but leaves at least parts of the external contact elements 24 to 26 uncovered. Furthermore, parts of the substrate 10 may be left uncovered as well.

The mold material 27 may be composed of any appropriate thermoplastic or thermosetting material, in one embodiment it may be composed of a material commonly used in contemporary semiconductor packaging technology. Various techniques may be employed to cover the components of the device 200 with the mold material 27, for example compression molding or injection molding.

Figure 3:
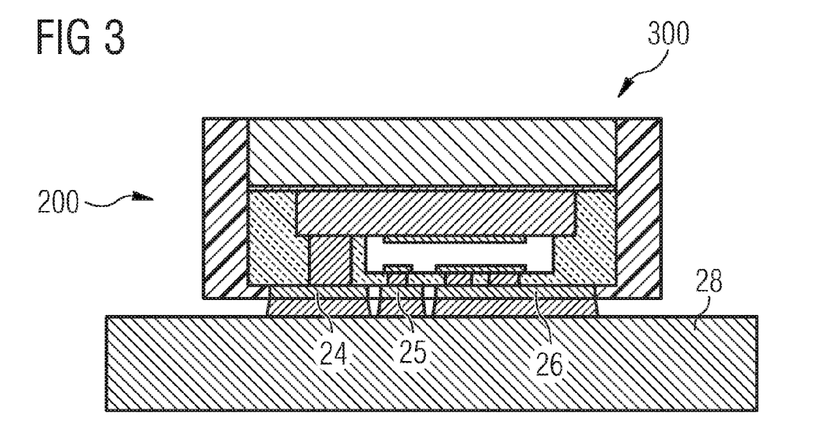
FIG. 3 schematically illustrates a device 300 according to a further exemplary embodiment.

The exposed surfaces of the external contact elements 24 to 26 may be used to electrically couple the device 200 to other components. This is exemplarily illustrated in FIG. 2. There, an excerpt of a device 300 is schematically illustrated which includes the device 200 that is mounted onto a circuit board 28, for example a PCB (Printed Circuit Board). The exposed surfaces of the external contact elements 24 to 26 may have been soldered to contact areas of the circuit board 28.

Figure 4:
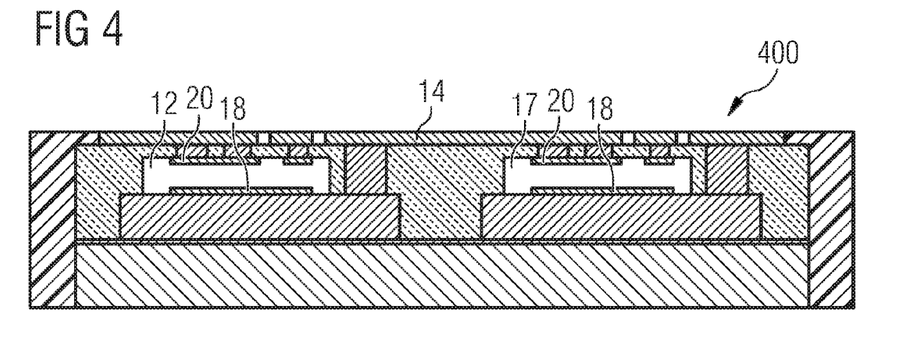
FIG. 4 schematically illustrates a device 400 according to a further exemplary embodiment.

On top of the device 200, a heat sink or cooling element may be attached (not illustrated in FIG. 3). The heat sink or cooling element is electrically insulated from the first electrically conductive layer 11 by the electrically insulating substrate 10. However, if the thermal conductivity of the substrate 10 is high enough, the substrate 10 allows to transfer the heat generated by the semiconductor chip 12 to the heat sink or the exposed surface of the substrate 10 where the generated heat is dissipated. Furthermore, the heat generated by the semiconductor chip 12 can be transferred by the second electrically conductive layer 14 to the outer surface of the device 200 where it is dissipated. It is obvious to a person skilled in the art that the devices 100 and 200 illustrated in FIGS. 1E and 2I are only intended to be exemplary embodiments, and many variations are possible. For example, the devices may include more than one semiconductor chip. Such an embodiment is illustrated in FIG. 4. There, a device 400 is illustrated which is a modification of the device 200 and includes the first semiconductor chip 12 and the second semiconductor chip 17. The two semiconductor chips 12 and 17 may be electrically coupled to each other by using the second electrically conductive layer 14. In the device 400 illustrated in FIG. 4 the drain electrode 18 of the first semiconductor chip 12 is electrically coupled to the source electrode 20 of the second semiconductor chip 17.

Figure 5:
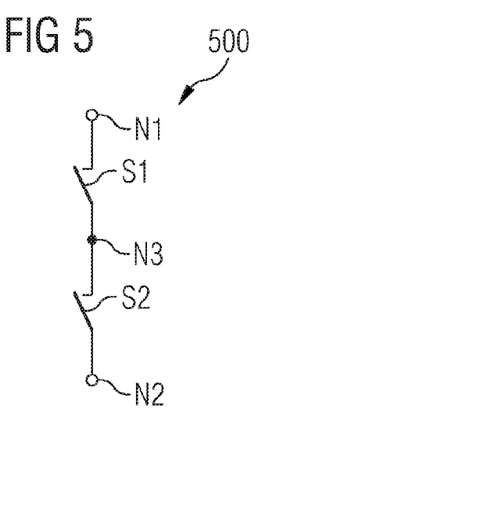
FIG. 5 illustrates a basic circuit of a half-bridge 500.

Having the connection as illustrated in FIG. 4, the device 400 can be used as a half-bridge. A basic circuit of a half-bridge 500 arranged between two knots N1 and N2 is illustrated in FIG. 5. The half-bridge 500 consists of two switches S1 and S2 connected in series. The semiconductor chips 17 and 12 may be implemented as the two switches Si and S2, respectively. When compared to the device 400 illustrated in FIG. 4, the node N1 is the drain terminal 18 of the second semiconductor chip 17, the node N3 arranged between the two switches S1 and S2 is the drain terminal 18 of the first semiconductor chip 12 and the node N2 is the source terminal 20 of the first semiconductor chip 12.

The half-bridge 500 may, for example, be implemented in electronic circuits for converting DC voltages, so-called DC-DC converters. DC-DC converters may be used to convert a DC input voltage provided by a battery or a rechargeable battery into a DC output voltage matched to the demand of electronic circuits connected downstream. DC-DC converters may be embodied as step-down converters, in which the output voltage is less than the input voltage, or as step-up converters, in which the output voltage is greater than the input voltage. Frequencies of several MHz or higher may be applied to DC-DC converters. Furthermore, currents of up to 50 A or even higher may flow through the DC-DC converters.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device, comprising:
   an electrically insulating substrate;
   a first electrically conductive layer applied over the electrically insulating substrate;
   a first semiconductor chip placed over the first electrically conductive layer, the first semiconductor chip comprising a first electrode on a first main surface and a second electrode on a second main surface;
   an electrically insulating layer applied over the first electrically conductive layer;
   a second electrically conductive layer applied over the electrically insulating layer; and
   a through connection in the electrically insulating layer coupling the first electrically conductive layer to the second electrically conductive layer,
   wherein the second electrically conductive layer comprises external contact elements.

2. The device of claim 1, wherein the substrate is a semiconductor substrate and has at least one electrically insulating surface.

3. The device of claim 2, wherein the at least one electrically insulating surface of the substrate comprises at least one of a semiconductor oxide, an organic material, a metal oxide, a ceramic material, diamond-like carbon and a p-n junction.

4. The device of claim 1, wherein the substrate is a ceramic substrate.

5. The device of claim 1, wherein the first electrically conductive layer has a thickness of more than 10 µm.

6. The device of claim 1, wherein the second electrically conductive layer is applied over the first semiconductor chip.

7. The device of claim 1, further comprising a second semiconductor chip placed over the electrically insulating substrate, wherein the second electrically conductive layer couples the first semiconductor chip to the second semiconductor chip.

8. The device of claim 1, wherein the first semiconductor chip is a power semiconductor chip.

9. The device of claim 1, wherein the material of the electrically insulating substrate has a thermal conductivity of more than 10 W/(m·K).

10. The device of claim 1, wherein at least one of the external contact elements is electrically coupled to the first electrically conductive layer.

11. A device, comprising:
    a substrate having a thermal conductivity of more than 10 W/(m·K), at least a first surface of the substrate being electrically insulating;
    a first electrically conductive layer applied over the first surface of the substrate;
    a power semiconductor chip placed over the first electrically conductive layer, the power semiconductor chip comprising a first electrode on a first main surface and a second electrode on a second main surface;
    an electrically insulating layer applied over the first electrically conductive layer;
    a second electrically conductive layer applied over the electrically insulating layer; and
    a through connection in the electrically insulating layer coupling the first electrically conductive layer to the second electrically conductive layer,
    wherein the second electrically conductive layer comprises external contact elements.

12. A device, comprising:
    an electrically insulating substrate having a thermal conductivity of more than 10 W/(m·K);
    an electrically conductive layer applied over the electrically insulating substrate;
    a semiconductor chip placed over the electrically conductive layer, the semiconductor chip having a first electrode on a first surface and a second electrode on a second surface opposite to the first surface;
    an electrically insulating layer applied over the electrically conductive layer; and
    external contact elements applied over the electrically insulating layer.

13. A device, comprising:
    an electrically insulating substrate;
    a first electrically conductive layer applied over the electrically insulating substrate;
    a first semiconductor chip placed over the first electrically conductive layer, the first semiconductor chip comprising a first electrode on a first main surface and a second electrode on a second main surface;
    an electrically insulating layer applied over the first electrically conductive layer;
    a second electrically conductive layer applied over the electrically insulating layer;
    a through connection in the electrically insulating layer coupling the first electrically conductive layer to the second electrically conductive layer; and
    a second semiconductor chip placed over the electrically insulating substrate, wherein the second electrically conductive layer couples the first semiconductor chip to the second semiconductor chip.

* * * * *